(12) United States Patent
Jenkins et al.

(10) Patent No.: US 7,170,310 B2
(45) Date of Patent: Jan. 30, 2007

(54) SYSTEM AND METHOD USING LOCALLY HEATED ISLAND FOR INTEGRATED CIRCUIT TESTING

(75) Inventors: Keith A. Jenkins, Sleepy Hollow, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 10/936,164

(22) Filed: Sep. 8, 2004

(65) Prior Publication Data

US 2006/0049843 A1 Mar. 9, 2006

(51) Int. Cl.
*G01R 31/26* (2006.01)
*G01R 31/28* (2006.01)

(52) U.S. Cl. .................................. 324/765
(58) Field of Classification Search ............... None
See application file for complete search history.

(56) References Cited

U.S. PATENT DOCUMENTS 6,181,143 B1 * 1/2001 Ghoshal ............... 324/752
6,455,336 B1   9/2002 Berndlmaier et al.
6,980,016 B2 * 12/2005 Pullen et al. ............ 324/760

OTHER PUBLICATIONS

Edward I. Cola, Jr., et al, Backside Localization of Open and Shorted IC Interconnections, 36th Annual Int'l Reliability PHysicis Symposium, Reno Nevada, 1998, pp. 129-136.

* cited by examiner

*Primary Examiner*—Jermele Hollington
*Assistant Examiner*—Trung Q. Nguyen
(74) *Attorney, Agent, or Firm*—Keusey, Tutunjian & Bitetto, P.C.; Richard Lau, Esq.

(57) ABSTRACT

A test system and method for integrated circuits includes an energy source having an adjustable energy rate, and a feedback device, which measures a physical quantity at a discrete position on an integrated circuit. A control circuit adjusts the power source to externally apply energy to the integrated circuit at the discrete position. A circuit tester applies test programs to the integrated circuit while the discrete position is maintained at a value of the physical quantity in accordance with the control circuit.

26 Claims, 5 Drawing Sheets

US 7,170,310 B2

SYSTEM AND METHOD USING LOCALLY HEATED ISLAND FOR INTEGRATED CIRCUIT TESTING

BACKGROUND OF THE INVENTION

1. Field of the Invention

The present invention relates to integrated circuit testing, and more particularly to a system and method for controlling temperatures of a chip during testing.

2. Description of the Related Art

As complementary metal oxide semiconductor (CMOS) technology scales, direct current (D.C.) leakage currents increase dramatically. This problem has risen to near crisis levels for high temperature burn-in testing used to accelerate processing faults in CMOS integrated circuits. Technology scaling has permitted multiple cores to exist on the same chip. Cores may be discrete energy sources and may be associated with parts of a chip (e.g., functional blocks), such as processors, parts thereof or other components, which generate heat. Device leakage at test temperatures in excess of 140° C. can dissipate leakage power in excess of 2000 Watts. This high power at voltages of 1 Volt results in excessive current draw.

These currents exceed the limits of current test equipment. Conventional methods for high temperature testing use a test oven or hot plate to heat the entire silicon chip, while a high stress voltage is applied to the chip under test (CUT). FIG. 1 shows a rendering of a heat map of a conventional multiprocessor chip under burn-in test while being heated by a thermal oven. In this example, a multiprocessor chip 10 includes two identical processor cores 12 and 14, and a shared SRAM cache 16. A uniform solid color indicates a uniform high heat map emanating from the chip under test operation. Diagonal shading indicates lower temperatures, and dotted shading indicates higher temperatures.

During conventional test operation, the entire chip 10 is heated to a high burn-in temperature, while test vectors are applied to the chip by an automated tester, to electrically stimulate a portion of the chip in an effort to accelerate defects.

FIG. 2 shows the leakage current dependence of a typical CMOS 130 nm process. As can be seen in FIG. 2, as the temperature is elevated to a typical burn-in condition of 140 degrees Celsius, the D.C. leakage current consumption of the devices can increase by up to 5–10 times the value at normal operating conditions. The D.C. leakage current consumption typically constitutes up to 30% of the normal power consumption of a high performance processor. A 100 Amp processor core could easily have 30 Amps of leakage at normal operating temperatures. At high temperatures, the total core current consumption could increase to 250 Amps. Two cores would consume 500 Amps, and at 1.6 Volts power supply, the chip would consume over 800 Watts without including the SRAM cache.

Existing methods of using voltage islands can be used to partition the CUT into voltage islands to allow testing of individual portions of the chip. This method can be used to limit the total amount of current needed to be delivered to the chip, by only powering up a portion of the chip while it is being heated up. This method has drawbacks because it forces a voltage island to exist in the chip, and can limit maximum frequency of the chip in normal operation by creating non-uniform voltage regions. It also can increase the total number of supply pins needed for the chip.

Previous attempts at localized heating have been disclosed, which employed stepped laser shining on the backside of a chip in a system designed to isolate faults in the design. These systems used a constant current power source and measured the local change in supply voltage (VDD) as a way to isolate increased power consumption. This system is not intended and not suitable for high speed manufacturing burn-in since it relies on a constant current supply instead of a more typical elevated constant voltage supply. It also has no built in apparatus to allow direct detection of on-chip temperature to control the location of the laser beam.

SUMMARY OF THE INVENTION

A test system for integrated circuits includes an energy source having an adjustable energy rate, and a feedback device, which measures a physical quantity at a discrete position on an integrated circuit. A control circuit adjusts the power source to externally apply energy to the integrated circuit at the discrete position. A circuit tester applies test programs to the integrated circuit while the discrete position is maintained at a value of the physical quantity in accordance with the control circuit.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention employs "thermal islands" within a chip that do not require any voltage supply partitioning in the chip. The thermal island is created by externally heating a location on the chip with a point heat source such as a pulsed high power laser. Integrated thermal circuits, such as diode circuits and control circuits are provided on the chip at key locations. These thermal circuits can be employed with a feedback loop to regulate the laser pulse rate to insure a precise local heating of the chip. This, in turn permits the entire chip to be powered at the same power supply level, while only a portion of the chip is heated to levels that will accelerate thermal faults. After a particular (x1,y1) location is tested, the point source can be electronically repositioned automatically to test another (x2,y2) location of the chip.

It should be understood that the elements shown in FIGS. may be implemented in various forms of hardware, software or combinations thereof. Preferably, these elements are implemented in a combination of hardware and software on one or more appropriately programmed general-purpose digital computers having a processor and memory and input/output interfaces.

Figure 1:
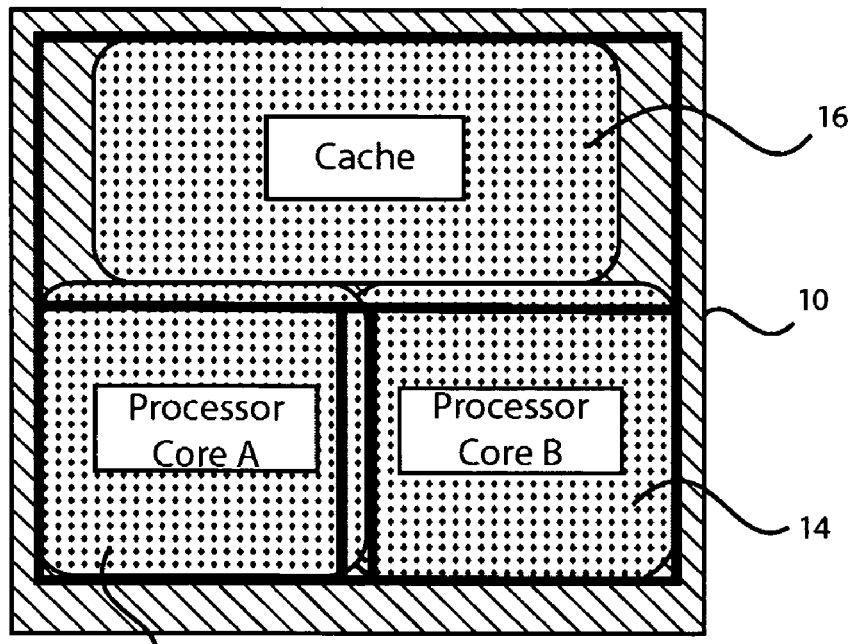
FIG. 1 is a diagram showing a heat map of a multiprocessor chip in accordance with the prior art.
Figure 2:
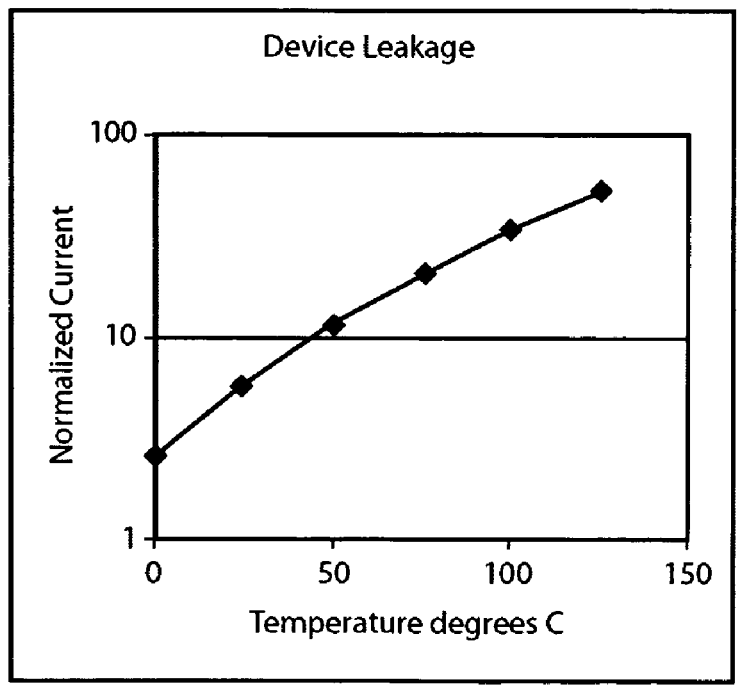
FIG. 2 is a plot showing normalized current versus temperature to illustrate temperature dependence of MOS device leakage current for a typical 130 nm CMOS in accordance with the prior art.
Figure 3:
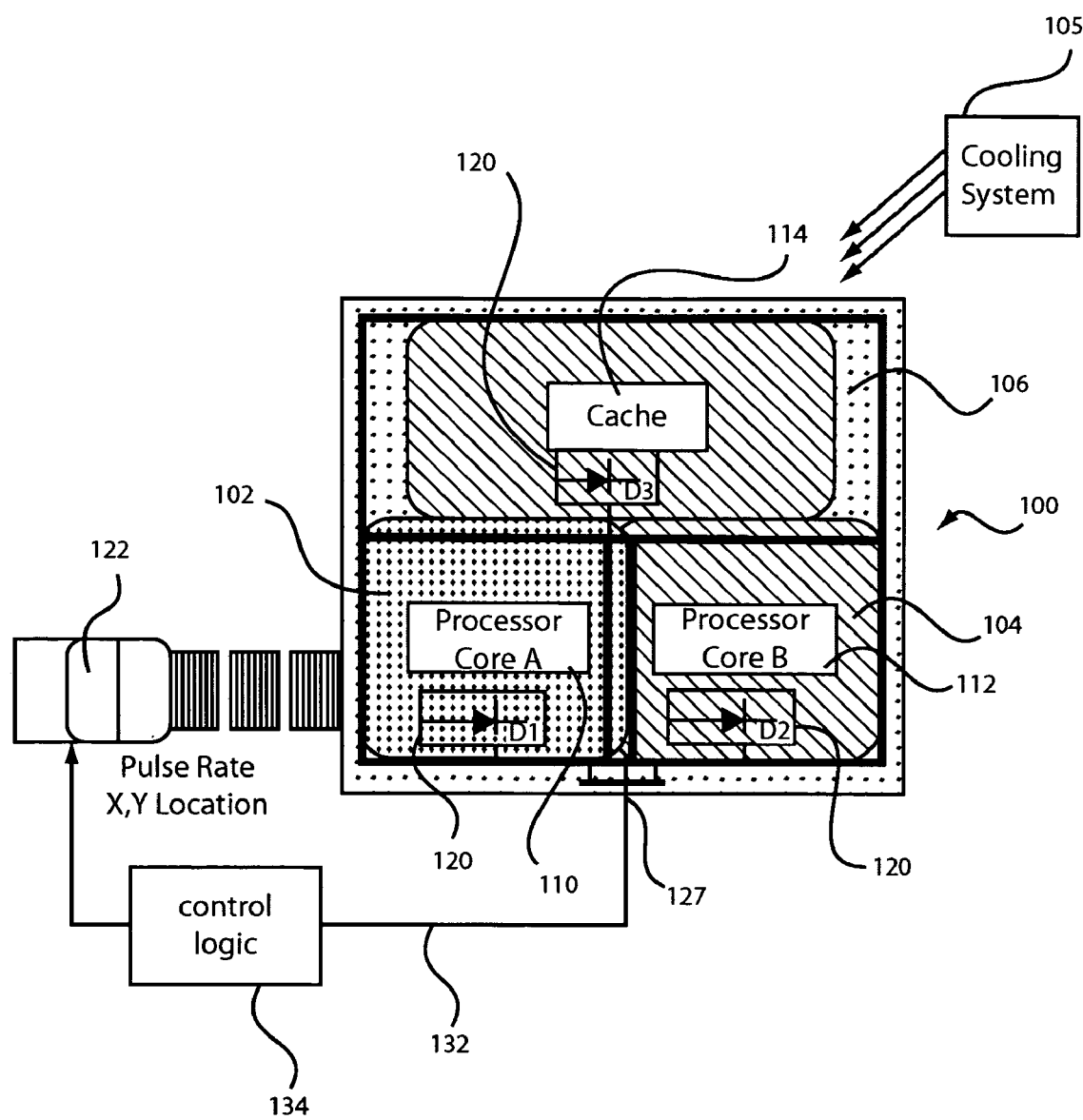
FIG. 3 is a schematic diagram showing a locally heated thermal island heat map and system in accordance with the present invention.

Referring now to the drawings in which like numerals represent the same or similar elements and initially to FIG. 3, one exemplary embodiment of the present invention is shown. An integrated circuit or semiconductor chip 100 includes multiple portions 102, 104 and 106. These portions may be determined or defined based upon the type of components or the applications of these portions for the chip 100. In the example shown, chip 100 includes two processors 110 and 112, one in each of portions 102 and 104, respectively. Processors 110 and 112 share a cache 114 in portion 106. Each portion 102, 104 and 106 is considered a thermal island. Each thermal island may be thermally separated or isolated from other portions or thermal islands on the chip 100.

Each portion 102, 104 and 106 includes one or more thermal sensor circuits 120. Thermal circuits 120 provide feedback temperatures to permit and external thermal energy source 122 to control the energy imparted to each portion 102, 104, 106.

Thermal islands within a chip do not require any voltage supply partitioning in the chip. The thermal island is preferably externally created by heating a location on the chip with external thermal energy source 122. Source 122 is preferably a point source heat source such as a pulsed high power laser, an ion or electron beam gun or other radiant energy source. In one example, source 122 may include an infrared lamp or ultraviolet lamp, which may be employed with a heat shield mask and/or lens to direct radiant energy to positions on chip 100.

In one embodiment, thermal sensor circuits 120 include integrated thermal diode circuits (e.g., D1, D2, D3) and control circuits added to the chip at predetermined locations. These diode circuits (D1, D2, D3), can be used within a feedback loop 132 to regulate a laser pulse rate to insure a precise local heating of the chip 100 at a particular location (X1, Y1).

In this way, the entire chip 100 can be powered at the same power supply level, while only a portion of the chip 100 is heated to levels that will accelerate thermal faults. After a particular (X1, Y1) location is tested, the laser 120 or the chip 100 can be electronically repositioned automatically to test another (X2, Y@) location of the chip 100.

In one embodiment, multiple portions (102, 104 or 106) may be heated simultaneously. The heated portion may be tested together or separately as well. Multiple portions may be heated concurrently to save time.

The illustrative system of FIG. 3 describes a possible setup for creating a "thermal island" for burn-in or IDDQ testing of chip 100. Chip 100 may include portions or thermal islands, e.g., multiple high power processing cores integrated on a chip with a cache memory or other devices. Each logical region or portion (e.g., 102, 104 and 106) has one or more thermal sensors 120 integrated on the chip 100. Each thermal diode sensor 120 has a digital (or analog) sense signal output that is preferably multiplexed out to a single sense-out pin 127. The sense-out pin 127 may be a serial digital (or analog) bus signal that represents the thermal sensor (e.g., diode sensor) 120 output, which is proportional to a local substrate temperature on chip 100.

In one embodiment, to enhance the thermal gradient between the thermal island being tested and the non-tested circuitry on the chip, it may be beneficial to cool the entire chip in conjunction with localized heating. This can be accomplished by applying a forced air system 105 during the testing of the chip. Forced air system 105 may be employed to cool the chip prior to or during testing.

The sense-out signal is fed into test control logic 134 that is used to regulate the pulse rate (or intensity) of a high power laser (or other focused light source that can create sufficient heat). If the thermal sensor temperature 120 measures too low of a temperature, the laser pulse rate is increased steadily until the temperature sensor 120 indicates the desired temperature. Likewise, if the thermal sensor 120 indicates too high of a temperature, the pulse rate is decreased.

During the heating and after the desired temperature range is reached for the region being heated, chip 100 is powered up to run burn-in tests or other electrical tests. Advantageously, the tests are run at full power and full operation frequencies to more accurately simulate accelerated operation conditions on the chip 100.

After the testing is finished for, say, processor core A, the (X1, Y1) location of the laser is adjusted to point to, say, processor core B (X2, Y2) and the test is repeated. This can be performed on one or more portions or thermal islands on the chip 100. This method can be used to isolate logically distinct and logically indistinct regions on a chip, to limit the total amount of current being drawn by the chip during burn-in testing.

Figure 4:
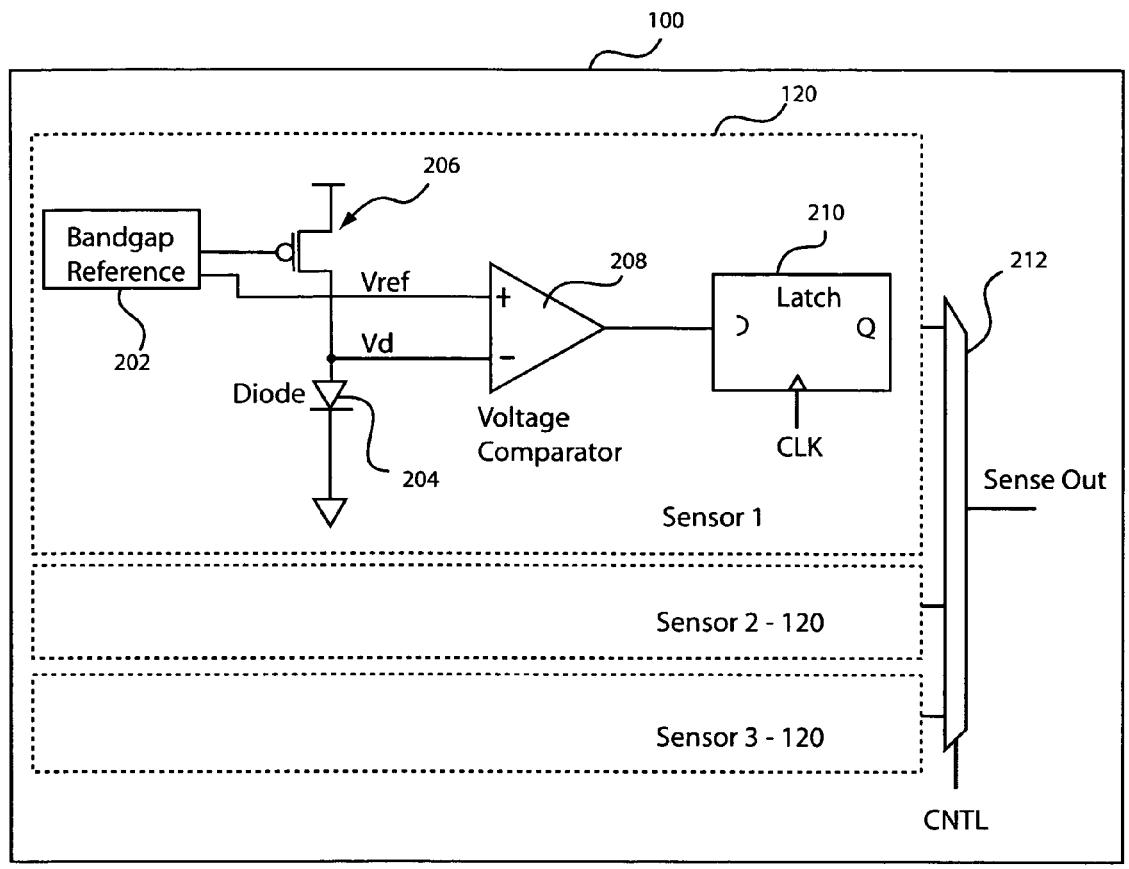
FIG. 4 is a schematic diagram showing a plurality of temperature sensors being multiplexed for a single output in accordance with the present invention.

Referring to FIG. 4, one illustrative implementation of an integrated temperature sensor system 120 that can sense local on-chip temperatures is shown. The operation of the sensor circuit 120 in this embodiment will now be described. A bandgap voltage reference circuit 202 creates a temperature independent voltage source that is used to bias a p-doped metal oxide semiconductor (PMOS) device 206 to create a reference current (Id) through a diode 204. The voltage Vd across the diode 204 is given by:

$$Vd = (kT/q)\ln(Id/Is);$$

where k is Boltzman's Constant, q is the electron charge, T is the temperature, Id is the current through the diode, and Is is the reverse biased diode current.

For a constant diode current Id, the voltage Vd will be directly proportional to the temperature T. A voltage comparator 208 is then used to sense the diode voltage relative to a reference voltage Vref generated by the bandgap voltage circuit 202 to establish a temperature independent voltage at which the diode voltage Vd will cross at the desired burn-in temperature T. The output of the voltage comparator 208 is latched by a latching circuit 210, and the output of the latch 208 is multiplexed by a multiplexer 212 to the chip output (Sense Out) according to a digital control signal CNTL. Multiple sensor circuits 120 maybe multiplexed to the chip output by the multiplexer 212.

Figure 5:
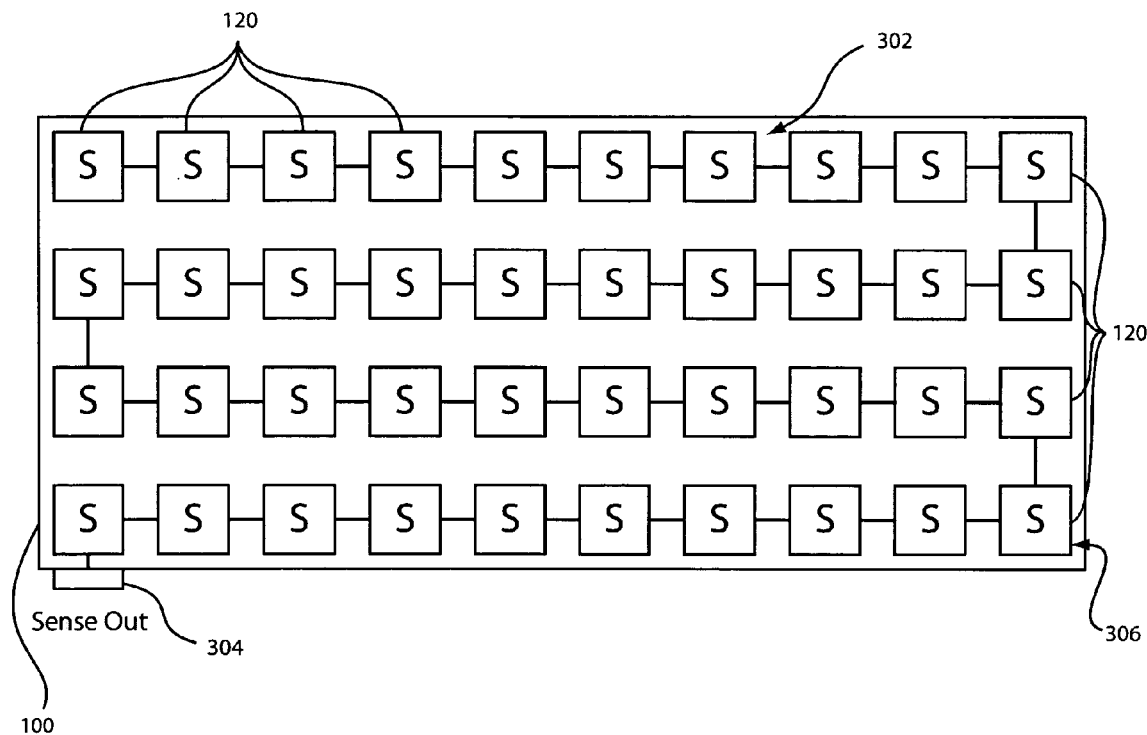
FIG. 5 is a schematic diagram showing a plurality of temperature sensors serially connected to for a scan chain with a single output in accordance with another embodiment of the present invention.

Referring to FIG. 5, an integrated array 302 of digital temperature sensors 120 similar to the one shown in FIG. 4 are arranged having a scanable output latch 304. The array 302 is used to help position an energy beam 122, e.g., a laser beam so that it is correctly focused on a thermal island. Before the burn-in period is started, the sensor outputs are scanned out through a scan chain 306, and the position of the laser is determined by the contents of the scan chain 306. If the contents do not match correctly to the expected contents, the laser position in incremented accordingly.

Figure 6:
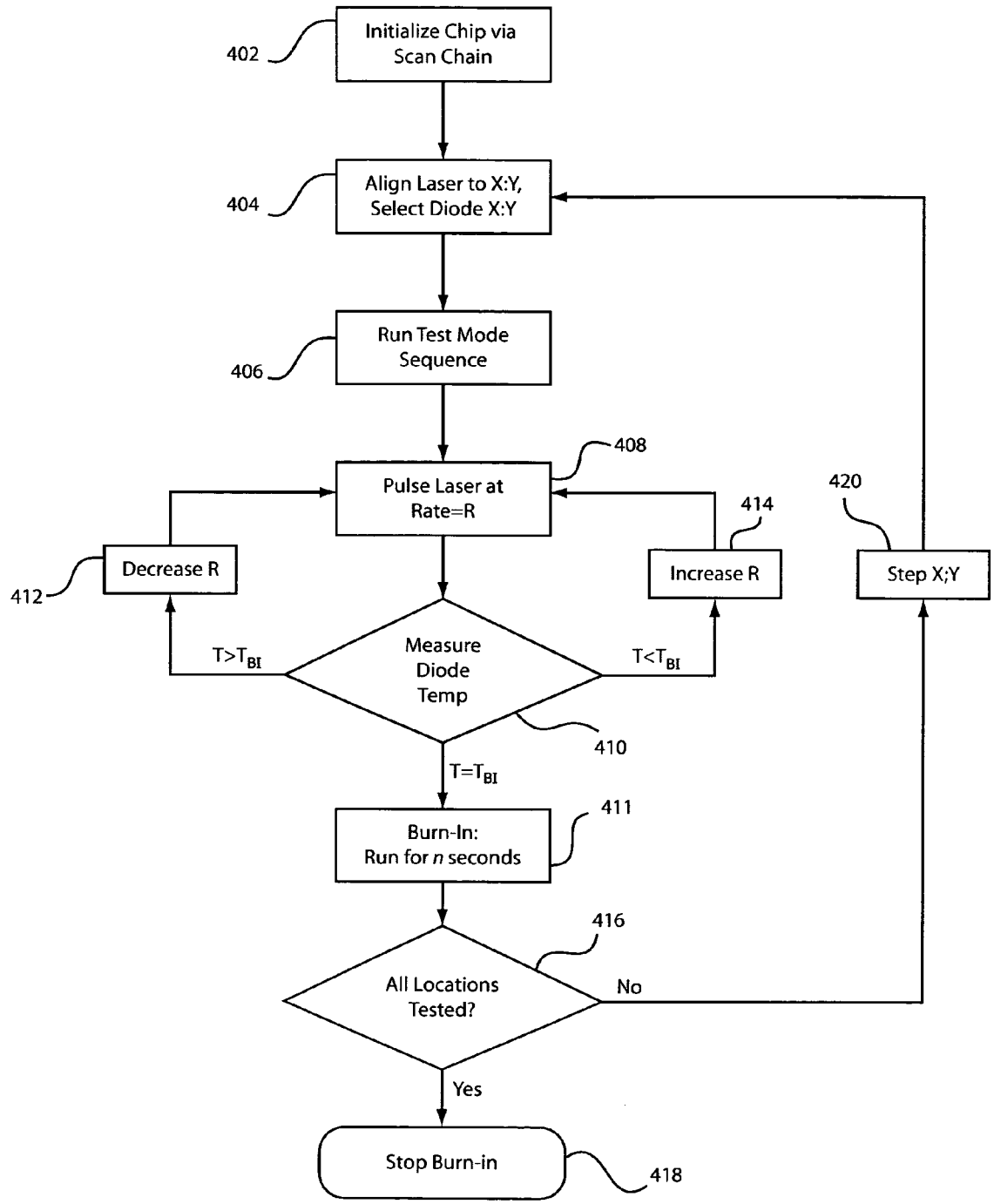
FIG. 6 is a block diagram showing control logic for adjusting the energy source in accordance with the present invention.

Referring to FIG. 6, a flow diagram is shown for controlling localized heating during chip testing using control logic (134). In block 402, the chip is initialized using a scan chain. Since the scan chain includes a discrete number of positions arranged in a known order, all sensors should initially have a same temperature. Additionally, the initialization in block 402 may include cooling the chip to a reduced temperature to enhance the thermal gradient during testing. The same temperature of the sensors would therefore be a reduced temperature.

In block 404, a laser or other source is aligned to a position (e.g., X, Y) thereby selecting a diode or other temperature sensor circuit 120 in that particular location to be employed for feedback control of the heat source.

In block 406, the chip test is begun by running the program sequence for testing the chip or chips. During this testing, the temperature of the temperature sensor is intermittently or constantly measured by outputting all of the scan chain data. The position of the laser is tested against the position in the scan change with the elevated temperature measurement. Since the data is latched, the number of clock cycles is representative of the position in the sensor array.

In block 408, the energy source is pulsed at an initial rate, R. In block 410, the temperature at the laser location is measured/tested. If the temperature T is sufficient, e.g., T=burn-in temperature $T_{BI}$, or in an acceptable range thereof, then the burn-in test is run for a predetermined amount of time in block 411.

If T is less than $T_{BI}$, then R is decreased in block 412. If T is greater than $T_{BI}$, then R is increased in block 414. This loop is run until $T_{BI}$ is achieved at a given location (thermal island). In the case of a pulsed laser, the pulse rate R is modulated; however, other features such as power, pulse width, frequency or other physical quantities may also be controlled and modulated in accordance with the present invention.

In block 416, a check is performed to determine whether all locations have been tested. If all positions (thermal islands) have been visited, the program terminates in block 418. Otherwise, the position of the energy source is changed in block 420 and the program returns to block 404. Once all positions have been tested, the program ends in block 418.

Having described preferred embodiments of a system and method for locally heated islands for integrated circuit testing (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A test system for integrated circuits, comprising:
an energy source having an adjustable energy rate;
a feedback device, which measures a physical quantity at a discrete position on an integrated circuit;
a control circuit which adjusts the energy source to externally apply energy to the integrated circuit at the discrete position; and
a circuit tester to apply test programs to the integrated circuit while the discrete position is maintained at a value of the physical quantity in accordance with the control circuit.

2. The system as recited in claim 1, wherein the integrated circuit includes a semiconductor chip.

3. The system as recited in claim 1, wherein the energy source includes a laser and the energy rate includes a pulse rate.

4. The system as recited in claim 1, wherein the feedback device includes a temperature sensor.

5. The system as recited in claim 4, wherein the temperature sensor includes a diode sensor circuit.

6. The system as recited in claim 1, wherein the physical quantity includes temperature and the control circuit includes logic, which adjusts the energy rate up if the temperature is below a threshold and adjusts the energy rate down when the temperature is above the threshold.

7. The system as recited in claim 1, wherein the feedback device includes a plurality of temperature sensors, each temperature sensor being associated with a discrete position on the integrated circuit.

8. The system as recited in claim 7, wherein the plurality of temperature sensors has their output multiplexed to a single output of the integrated circuit.

9. The system as recited in claim 7, wherein the plurality of temperature sensors is serially connected to from a scan chain such that the single output provides information about a position of the laser.

10. The system as recited in claim 1, wherein the control circuit modifies a position of the energy source to provide energy to a different discrete location on the integrated circuit.

11. The system as recited in claim 1, further comprising a cooling system to enhance a temperature gradient between the discrete position and other portions of the integrated circuit.

12. A test system for integrated circuits, comprising:
a laser having an adjustable pulse rate;
a temperature sensor, which measures temperature at a discrete position on an integrated circuit;
a control circuit which adjusts the pulse rate of the laser to externally apply energy to the integrated circuit at the discrete position to maintain a temperature locally at the discrete position on the integrated circuit; and
a circuit tester to apply test programs to the integrated circuit while the discrete position is maintained at the temperature in accordance with the control circuit.

13. The system as recited in claim 12, wherein the integrated circuit includes a semiconductor chip.

14. The system as recited in claim 12, wherein the temperature sensor includes a diode sensor circuit.

15. The system as recited in claim 12, wherein the control circuit includes logic, which adjusts the energy rate up if the temperature is below a threshold and adjusts the energy rate down when the temperature is above the threshold.

16. The system as recited in claim 12, wherein the feedback device includes a plurality of temperature sensors, each temperature sensor being associated with a discrete position on the integrated circuit.

17. The system as recited in claim 16, wherein the plurality of temperature sensors has their output multiplexed to a single output of the integrated circuit.

18. The system as recited in claim 16, wherein the plurality of temperature sensors is serially connected to form a scan chain such that the single output provides information about a position of the laser.

19. The system as recited in claim 12, wherein the control circuit modifies a position of the energy source to provide energy to a different discrete location on the integrated circuit.

20. The system as recited in claim 12, further comprising a cooling system to enhance a temperature gradient between the discrete position and other portions of the integrated circuit.

21. An integrated circuit device configured for testing, comprising:
   an integrated circuit chip including a plurality of logical regions forming thermal islands;
   a temperature sensor associated with each logical region such that when energy is locally applied from an external energy source to one of the logical regions, a temperature is measured by the temperature sensor; and
   a feedback loop which provides the measured temperature to the external energy source to provide for an adjustment thereof such that when a predetermined temperature is maintained locally on one of the thermal islands, a burn-in test for the integrated circuit chip is conducted while the chip is operational.

22. The device as recited in claim 21, wherein the logical regions include one of processors and caches.

23. The device as recited in claim 21, wherein the feedback loop includes a plurality of serially connected temperature sensors, each temperature sensors being associated with one of the logical regions.

24. The device as recited in claim 23, wherein the plurality of temperature sensors forms a scan chain such that a single output of the scan chain provides information about a position of the energy source acting of the chip.

25. The device as recited in claim 23, wherein the device includes a plurality of temperature sensors, which have their output, multiplexed to a single output of the integrated circuit.

26. The device as recited in claim 21, further comprising a cooling system to enhance a temperature gradient between a logical region under test and other portions of the integrated circuit chip.

* * * * *